United States Patent
Metz

(10) Patent No.: US 9,257,529 B2
(45) Date of Patent: Feb. 9, 2016

(54) METHOD OF FORMING SELF-ALIGNED CONTACTS USING A REPLACEMENT METAL GATE PROCESS IN A SEMICONDUCTOR DEVICE

(71) Applicant: Tokyo Electron Limited, Tokyo (JP)

(72) Inventor: Andrew Metz, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 10 days.

(21) Appl. No.: 14/203,838

(22) Filed: Mar. 11, 2014

(65) Prior Publication Data

US 2015/0263131 A1    Sep. 17, 2015

(51) Int. Cl.
| | | |
|---|---|---|
| H01L 21/44 | (2006.01) | |
| H01L 29/66 | (2006.01) | |
| H01L 29/49 | (2006.01) | |
| H01L 29/40 | (2006.01) | |
| H01L 21/768 | (2006.01) | |

(52) U.S. Cl.
CPC .... *H01L 29/66545* (2013.01); *H01L 21/76879* (2013.01); *H01L 29/401* (2013.01); *H01L 29/495* (2013.01)

(58) Field of Classification Search
USPC .......................................................... 438/597
See application file for complete search history.

(56) References Cited

U.S. PATENT DOCUMENTS

| | | |
|---|---|---|
| 5,792,703 A | 8/1998 | Bronner |
| 6,162,690 A | 12/2000 | Lee |
| 6,268,281 B1 | 7/2001 | Shih |
| 7,897,499 B2 | 3/2011 | Lee |
| 2004/0229473 A1 | 11/2004 | Bohr |
| 2011/0079862 A1 | 4/2011 | Rachmady |
| 2011/0156107 A1 | 6/2011 | Bohr |
| 2014/0110794 A1* | 4/2014 | Xie et al. ............... 257/401 |

* cited by examiner

*Primary Examiner* — Asok K Sarkar
(74) *Attorney, Agent, or Firm* — Wood, Herron & Evans, LLP

(57) ABSTRACT

Techniques disclosed herein provide a gate pitch scaling solution for creating source/drain contacts in a replacement metal gate fabrication scheme. Such techniques provide a self-aligned contact process that protects gate electrodes from shorts due to etching from misaligned patterns. Techniques herein provide a dual layer cap formed by making a semi conformal material deposition over a non-planar topography of RMG formation structures, and using selective etching and planarization to yield a dual layer protective cap that does not excessively increase an aspect ratio.

18 Claims, 4 Drawing Sheets

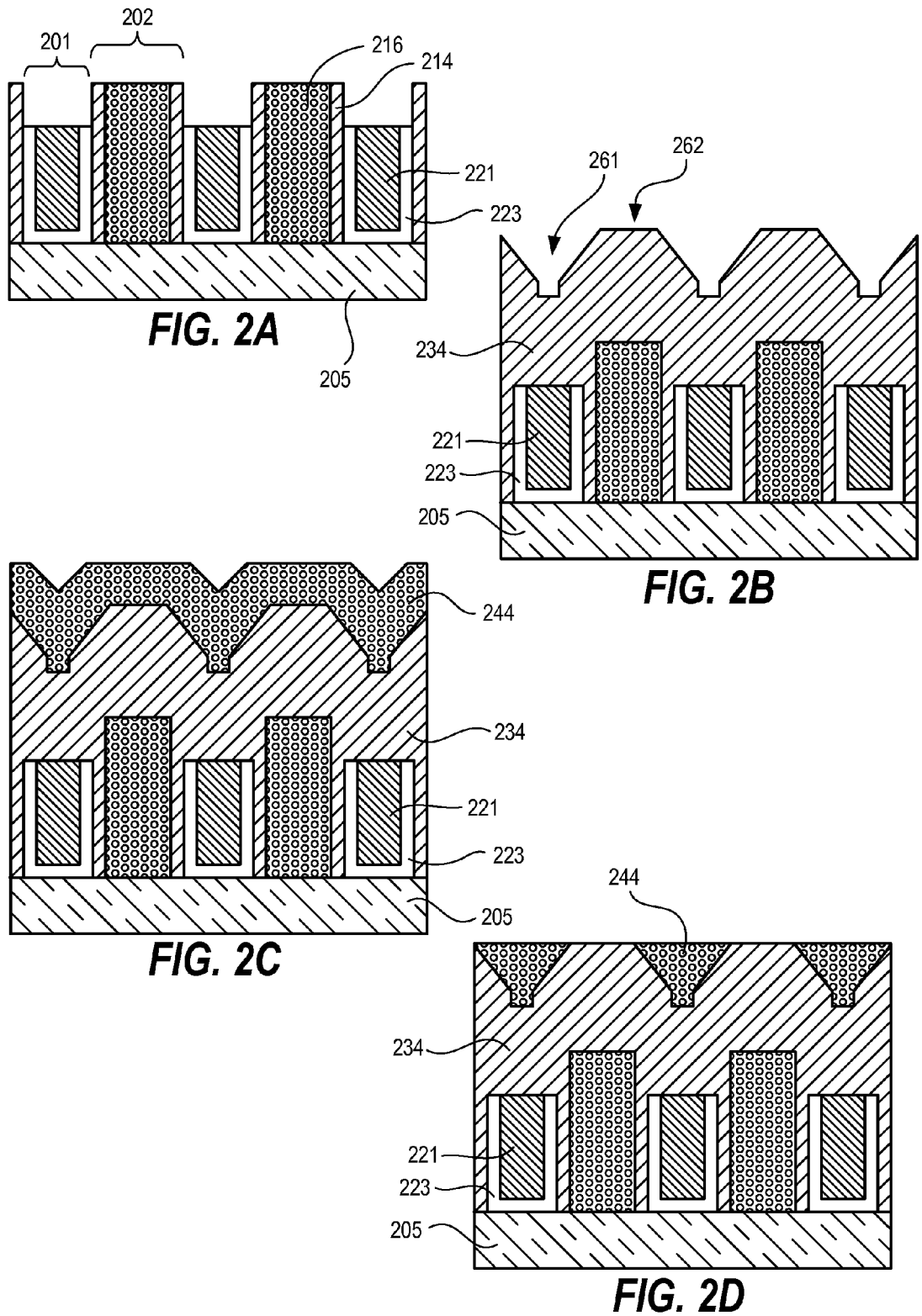

METHOD OF FORMING SELF-ALIGNED CONTACTS USING A REPLACEMENT METAL GATE PROCESS IN A SEMICONDUCTOR DEVICE

BACKGROUND OF THE INVENTION

The present disclosure relates to fabricating semiconductor devices. More particularly, the present disclosure relates to forming gate structures and making contacts to source and drain regions of a semiconductor structure.

Transistors, such as field effect transistors (FETs) are the basic elements of microelectronics and integrated circuits. There has been a continuous drive to scale down or shrink transistors and other semiconductor devices to increase density and improve processing performance. One technique that is used to fabricate transistors is known as a replacement metal gate (RMG) process. A replacement metal gate process involves creating a sacrificial or dummy gate during fabrication, and then later replacing the dummy gate with a metal gate electrode. Such a replacement technique can be used to fabricate metal-oxide-semiconductor field effect transistors (MOSFETs) and complementary metal oxide semiconductors (CMOS), which can be types of fin field effect transistors (FinFETs).

In a replacement metal gate fabrication process, a transistor can be fabricated using a dummy gate electrode. The dummy gate electrode can be made from a polysilicon material. This can be beneficial because polysilicon is able to tolerate high temperature processing better than most metals. Thus, polysilicon can be annealed at higher temperatures along with source and drain regions. In one RMG process flow, a dummy gate electrode is formed and then a source region and a drain region are formed adjacent to the dummy gate. The dummy gate is eventually replaced by a gate stack that can including a high dielectric constant (high-k) gate dielectric and/or a metal gate. Forming the gate stack after high temperature processing steps can result in minimal damage on the high-k gate dielectric and the metal gate. Additionally, a wider range of metals can be selected for the gate conductor.

After a dummy gate is replaced with a final gate or gate state, contacts can be made to the source and drain. Creating such contacts typically involves etching through one or more layers on a substrate. This etching can be assisted with etch masks patterned using lithography techniques. With etched openings created to source and drain regions, metal contacts can be formed and semiconductor fabrication continued to subsequent steps, such as interconnect or wiring steps.

SUMMARY

As critical dimensions of transistors shrink, it becomes more difficult to make accurate connections to source and drain. This is especially true with FinFET transistors. For example, with a gate pitch of 80 nanometers or greater, a mask pattern for source or drain contact etch consistently lands between gates of a transistor using conventional patterning technology and without using protective cap layers. With a shrinking gate pitch, however, lithographic overlay misalignment becomes a significant problem. With misalignment, etch steps can create shorts between source/drain and gate electrodes because the etch pattern can overlap both the gate and the source or drain. A gate cap can be used to compensate for overlay error. During the replacement gate process, a dielectric cap is formed over the dummy gate and adjacent to a gapfill material. This cap, however, is typically too thin for adequate use to function as masks for executing a self-aligned contact etch to create a channel for source/drain contacts. Simply increasing cap height, however, it not a desirable solution because this increases an aspect ratio, which makes gate etch more difficult and also makes it more difficult for void free oxide fills.

Techniques disclosed herein provide a gate pitch scaling solution for creating source/drain contacts in a replacement metal gate fabrication scheme. Such techniques provide a self-aligned contact process that protects gate electrodes from shorts due to etching from misaligned patterns. Techniques herein provide a dual layer cap formed by using a material that is deposited semi-conformally and inherits some topography of RMG formation structures.

One embodiment includes a method of forming self-aligned contacts in a semiconductor device. This method includes receiving, creating, or providing a substrate having a first structure of a first material composition and a second structure of a second material composition. The second structure is formed immediately adjacent to the first structure. The first structure and second structure are different heights in that, paired together, the first structure and the second structure define a first topography that is non-planar at an upper surface of the structures. A first layer is deposited on the first topography. This first layer is partially conformal resulting in the first layer defining a second topography (non-planar topography). The first layer defines a valley over the first structure and forms a peak over the second structure. A second layer is deposited on the first layer. The second layer is sufficiently thick to fill the defined valley and cover the peak of the second topography—or to at least partially fill the defined valley. Then the second layer is planarized down to the first layer above the second structure such that the peak in the first layer is exposed while the defined valley of the first layer remains filled with the second layer. Exposed portions of the first layer are then etched down until reaching the second structure beneath the first layer. The second layer in the defined valley functions as a mask that impedes etching of the first layer above the first structure relative to etching of the first layer above the second structure.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 2A shows a cross-sectional view of a sequence step of semiconductor device fabrication using a self-aligned contact process.

FIG. 2B shows a cross-sectional view of a sequence step of semiconductor device fabrication using a self-aligned contact process.

FIG. 2C shows a cross-sectional view of a sequence step of semiconductor device fabrication using a self-aligned contact process.

FIG. 2D shows a cross-sectional view of a sequence step of semiconductor device fabrication using a self-aligned contact process.

DETAILED DESCRIPTION

Techniques disclosed herein provide a gate pitch scaling solution for creating source/drain contacts in a replacement metal gate fabrication scheme. Such techniques provide a self-aligned contact fabrication process that protects gate electrodes from shorts due to etching using misaligned patterns. Techniques herein include creating a dual layer cap formed by using a partially conformal materials applied on a topography of replacement metal gate (RMG) formation structures and other non-planar structures.

The self-aligned contact process disclosed herein can be applied to fabrication of many different types of transistors and semiconductor devices. For convenience in describing embodiments, this disclosure primarily focuses on self-aligned contact (SAC) etch after replacement metal gate formation of a FinFET device.

Figure 1A:
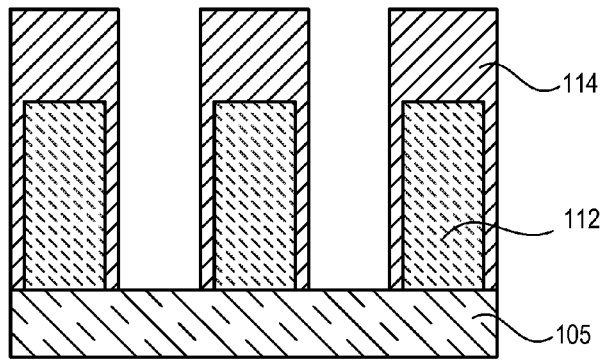
FIG. 1A shows a cross-sectional view of a sequence step of semiconductor device fabrication using a self-aligned contact process.

FIGS. 1A-1G illustrate a conventional method for preparing a replacement metal gate structure. The views in these figures show cross-sectional views of a FinFET formation showing orthogonal orientations looking parallel to fin or parallel to gate. FIG. 1A shows a cross-sectional view after spacer formation on a dummy gate. Dummy gate 112 (sacrificial gate) is covered with a conformal silicon nitride spacer 114. Below the dummy gate 112 and spacer 114 is substrate 105, which can include source and/or drain regions. Dummy gate 112 can be selected from various materials such as amorphous silicon, poly silicon, (doped or pure), etc. As illustrated, spacer 114 covers sidewalls of the dummy gate 112, as well as provides a cap (such as a silicon nitride hardmask) on dummy gate 112. There is a gap between spacers 114. This gap is filled with an oxide 116 or other fill material such as Low-K SiOCH, which isolates the dummy gate. The stack (set of features/layers on the substrate) can then be planarized such as using a chemical mechanical planarization process. After planarization, the cap or hardmask over the dummy gate 112 can be removed, followed by removal of the dummy gate 112 itself. Such cap and dummy gate removal can be executed using an etching process having a chemistry appropriate to selectively etch each targeted material. For example, a reactive ion etching process can be used initially, followed by a wet etching process.

Figure 1B:
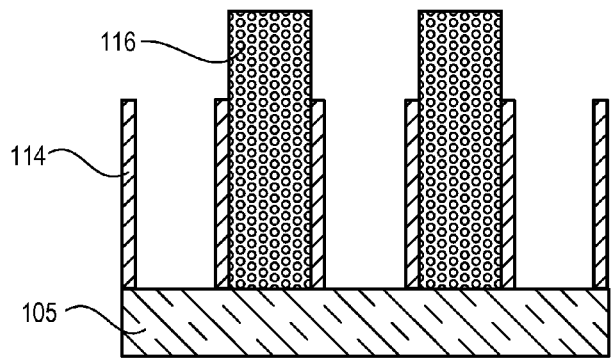
FIG. 1B shows a cross-sectional view of a sequence step of semiconductor device fabrication using a self-aligned contact process.
Figure 1C:
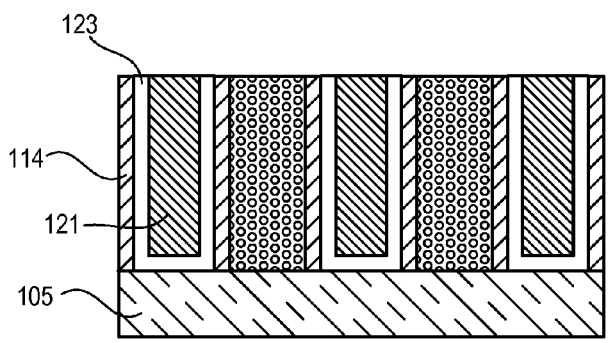
FIG. 1C shows a cross-sectional view of a sequence step of semiconductor device fabrication using a self-aligned contact process.

FIG. 1B shows a cross sectional view after oxide fill, dummy gate removal and cap removal. With the dummy gate 112 removed, the space formerly occupied by the dummy gate can be replaced with a metal gate 121. Prior to depositing a metal gate, the trench where the dummy gate was located can have a liner 123 deposited, such as by atomic layer deposition (ALD), coating the inside of the trench that used to be the dummy gate. Liner 123 can function as a gate dielectric. Multiple liners or protective films can be applied depending on a given device being fabricated. This liner 123 can be an oxide liner and can wrap up and down over fins during deposition. After the liner 123 is completely deposited, a work-function metal deposition can be executed. Example materials can be nitrides or carbides of titanium and aluminum, etc. The work function metal can be deposited conformally also. A total thickness and composition of the work-function layer can depend on a type of transistor being fabricated. A gate dielectric can be deposited via ALD. For example, this trench can be coated with hafnium oxide. FIG. 1C shows a cross-sectional view after creation of metal gate 121, liner 123, and any planarization steps. Metal gate 121 can be selected from tungsten, aluminum, etc. Metal gate 121 can thus become surrounded by liner 123, which can be a high dielectric constant (high-k) gate dielectric, and/or work function metal. Note that depositing the metal gate can involve any of several conventional patterning steps and layers (not shown).

Figure 1D:
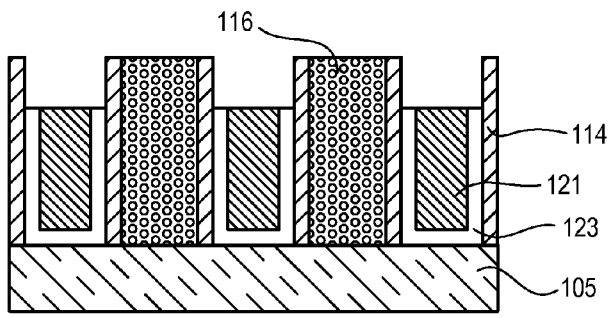
FIG. 1D shows a cross-sectional view of a sequence step of semiconductor device fabrication using a self-aligned contact process.
Figure 1E:
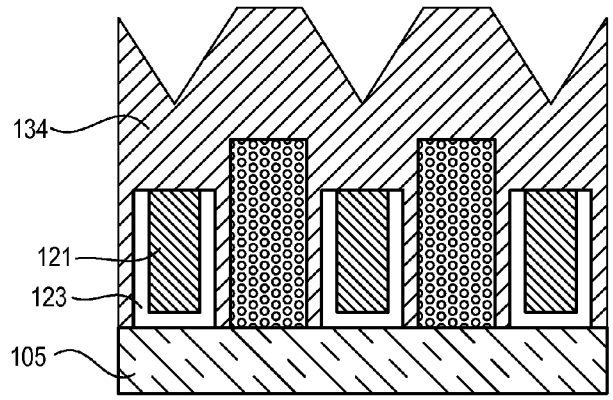
FIG. 1E shows a cross-sectional view of a sequence step of semiconductor device fabrication using a self-aligned contact process.
Figure 1F:
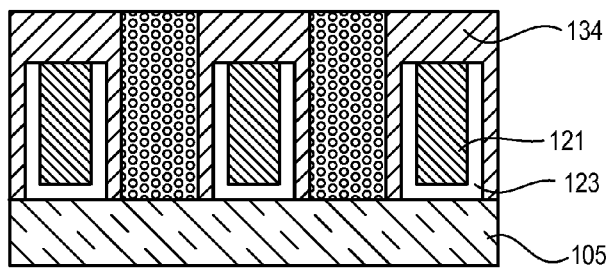
FIG. 1F shows a cross-sectional view of a sequence step of semiconductor device fabrication using a self-aligned contact process.
Figure 1G:
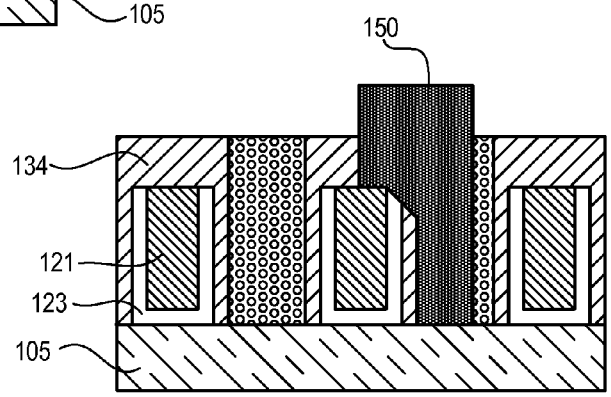
FIG. 1G shows a cross-sectional view of a sequence step of semiconductor device fabrication using a self-aligned contact process.

With metal gate 121 in place, a cap can be deposited on the metal gate. In one technique, the metal gate 121 and high-k gate dielectric are first recessed. FIG. 1D illustrates metal gate 121 after having been recessed below an upper horizontal surface of spacer 116. In FIG. 1E, a layer 134, such as a layer of dielectric material, is semi-conformally deposited over the structure from FIG. 1D. Note that the layer 134 partially conforms to structure heights in that a horizontal surface of layer 134 has recesses and protrusions corresponding to underlying structures. For example, layer 134 protrudes higher above spacer 116 as compared to a height above metal gate 121. After deposition of layer 134, the substrate stack is planarized. The result of planarizing layer 134 is shown in FIG. 1F. At this point, the substrate stack can be etched for contacts, such as via a self-aligned contact etch. This can involve several patterning steps and mask layers (not shown). The structure from FIG. 1F, however, is not effective for a self-aligned contact etch step—especially with decreasing feature sizes. Since selectivity of oxide etching is not perfect, when there is pattern overlay or misalignment, there is a danger of etching through the nitride cap corner over the metal gate and creating a short between the gate electrode and the source/drain. FIG. 1G illustrates a contact 150 filling a trench or via etched for a contact, but that has substantial corner etching as well. Note that contact 150 creates a short between metal gate 121 and substrate 105.

Thus, a significant challenge in executing self-aligned contact (SAC) etching is minimizing corner erosion. A nitride cap can be useful to prevent contact to a metal gate causing shorting. As such, having a minimum quality and thickness of dielectric between the two metals can help. Preserving as much nitride corner provides a better etch stop margin. Preserving the corner becomes more important with smaller feature sizes. For example, some caps may need to be limited to about 10 nanometers, and so being able to etch a high aspect ratio feature while maintaining/meeting selectivity to the nitride corner is very challenging. Another challenge is that the spacer and liner materials (for small feature sizes) can be deposited at relatively low temperature plasma-assisted chemical vapor deposition (CVD), which does not produce materials that are very etch resistant as compared to low-pressure CVD deposited nitrides or other higher quality nitrides.

Corner loss needs to be such that a minimum distance is maintained (for example, a minimum nitride thickness) between the conductor of the gate and the conductor of the contact. Some techniques to minimize corner loss include attempting to thicken the cap on top of the metal gate. Such simple cap thickening, however, leads to problems. For example, by substantially increasing the cap or spacer thickness/height, the aspect ratio is increased. The increase in aspect ratio then leads to voids during the fill process. Self-aligned contact etch also becomes difficult with the higher aspect ratio feature to etch through. A related attempt is to increase a liner thickness instead of increasing cap height, but the result is a wider dielectric layer, which can also lead to voids because of an increase in the aspect ratio of the oxide area. Recessing the metal deeper as a means of increasing cap height without increasing aspect ratio is also not an option because changing the height of the metal changes conductance of the gate. Thus, simply increasing cap height or liner thickness brings the challenges of voids in fills and/or longer etch times.

Figure 2E:
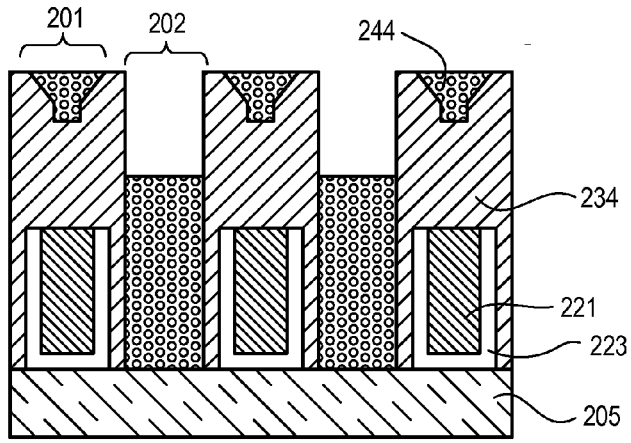
FIG. 2E shows a cross-sectional view of a sequence step of semiconductor device fabrication using a self-aligned contact process.

FIGS. 2A-2F illustrate a method of forming self-aligned contacts in a semiconductor device according to techniques herein. In a first step, a substrate 205 is received or provided. The substrate 205 has a first structure 201 of a first material composition and a second structure 202 of a second material composition. The first material composition can be different from the second material composition. Each structure can include more than one material or layer. For example, second structure 202 can include a spacer 216 as well as sidewall protection layer 214. Also, first structure 201 can include metal gate 221 and liner 223. The second structure 202 is formed immediately adjacent to the first structure 201. The first structure 201 and second structure 202 are of different heights relative to (measured from) substrate 205. The differing heights are such that together the first structure 201 and the second structure 202 define a first topography that is non-planar at an upper horizontal surface thereof. As can be seen in the example of FIG. 2A, there is a non-planar upper surface because the structures have a height difference. FIG. 2A illustrates an alternating pattern of first and second structures, but techniques herein can function with only a pair of adjacent structures.

In some embodiments, receiving a substrate having a first structure of a first material composition and a second structure of a second material composition can include preparing a replacement metal gate (RMG) structure of a gate device on a semiconductor substrate. This RMG structure can have a metal gate electrode as the first structure of the first material composition, with the metal gate electrode having a side barrier layer and a silicon oxide spacer in contact with the side barrier layer. The silicon oxide spacer can be the second structure of the second material. The metal gate electrode and the silicon oxide spacer can be different heights by creating a recess in the metal gate electrode from an initially planarized RMG structure. In one example, the metal gate electrode can be selected from tungsten. Preparing the replacement metal gate (RMG) structure of the gate device on the semiconductor substrate can include preparing the RMG structure of a fin field effect transistor (FinFET). The RMG structure can be formed by using double patterning or side wall image transfer. In some embodiments, the substrate can be received having a gate pitch less than approximately 64 nanometers.

Note that there are many different device and transistor arrangements that can be used with techniques herein, including planar and three dimensional FinFET transistors. Accordingly heights and aspect ratios can be specified by a particular device. By way of example, in some FinFET devices, a fin can be about 30 nm, and a metal gate should not be recessed below the fins and thus can be approximately around 35-50 nm. A nitride cap layer can be another 50 nanometers, and a total gate height can be about 150 nm. Note that these are merely example heights. Actual heights can be dictated in part by height of fins and fabrication of layers in a trench.

With such a non-planar topology on a substrate stack, a first layer 234 is deposited on the first topography (such as the initial topography shown in FIG. 2A). This first layer 234 is partially conformal in its deposition which results in the first layer defining a second topography. FIG. 2B illustrates a cross sectional view of this second topography. Note that the first layer 234 defines a valley 261 over the first structure 201 and forms a peak 262 over the second structure 201. Since the deposition is neither fully conformal nor fully planarizing, the first layer can result in an upper surface having a non-planar pattern on an upper surface thereof. This non-planar pattern can rise and fall depending on underlying structures. In other words, this first layer is deposited at a thickness that covers the underlying structures and that inherits underlying topology, but does not continue with a deposition until the first layer reaches an approximately planar upper surface. The first layer can be selected from various materials such as silicon nitride, and silicon carbide, and can function as a dielectric cap layer. The first layer can be deposited via conventional chemical vapor deposition (CVD) processes or other semi conformal deposition techniques. Depositing the dielectric cap layer on the RMG structure can include depositing a conformal layer of silicon nitride.

Thus, with several dielectric cap materials and deposition techniques, the dielectric cap layer is not perfectly conformal nor is it perfectly planarizing and so there are recesses that result in the dielectric cap layer. Moreover, the dielectric cap is not immediately planarized after deposition, but techniques herein advantageously use its semi-conformal topography.

After the deposition of the first layer 234, a second layer 244 is deposited on the first layer 234. The second layer deposits sufficient material, or becomes sufficiently thick, to fill the defined valley and cover the peak of the second topography. Second layer 244 can be conformally applied, or semi conformally applied. FIG. 2C illustrates an example substrate stack with the second layer 244 deposited over the first layer 234. The second layer can be selected from various materials such as silicon oxide, or low-K SiOCH, but it is more beneficial to select a same material as a contact interlevel dielectric.

Next, the second layer 244 on an upper portion thereof can be planarized down to the first layer 234 above the second structure such that the peak 262 in the first layer is exposed while the defined valley 261 remains filled with the second layer 244. FIG. 2D shows a non-limiting example cross section of filled valleys of the second layer 244 on the first layer 234 above the first structure 201. For example, this can be a selective oxide to nitride chemical mechanical planarization (CMP) step that retains oxide valley fills or plugs on the nitride (first) layer. In other embodiments, the second layer is deposited such that the second layer fills the defined valley, but while leaving a peak exposed, at least partially exposed, or thinly covered such that subsequent etching can readily break through to the first material layer to continue etching above the second structure without needing a planarizing step. Alternatively, a non-selective dry etch back can be executed, stopping once a SiN cap is exposed.

In FIG. 2E, an etching step can then be executed that etches exposed portions of the first layer 234 down until reaching the second structure 202 beneath the first layer 234. The second layer in the defined valley can function as a mask that impedes etching of the first layer 234 above the first structure 201 relative to etching of the first layer 234 above the second structure 202. An etching chemistry can be selected that etches the first layer material substantially faster than the second layer material. For example, when executing a silicon nitride cap open step to remove nitride between gates, the oxide valley fills protect the nitride cap over the gates resulting in a lower aspect ratio openings or recesses to subsequently fill.

Exposing portions of the dielectric cap layer, down until reaching the silicon oxide spacer beneath the dielectric cap layer, can include using an etch chemistry that is more selective to silicon nitride as compared to silicon oxide. Example etch chemistries can include oxide etch chemistries selective to SiN such as C4F8/Ar/O2 or C4F6/Ar/O2. The etching step in FIG. 2E can be a SiN etch selective to SiO2, which can use CH3F/Ar/O2 or CH2F2/Ar/O2 chemistries.

Figure 2F:
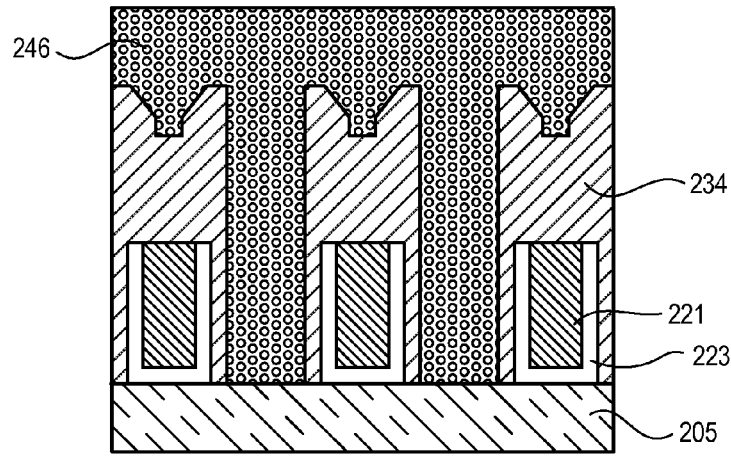
FIG. 2F shows a cross-sectional view of a sequence step of semiconductor device fabrication using a self-aligned contact process.
Figure 2G:
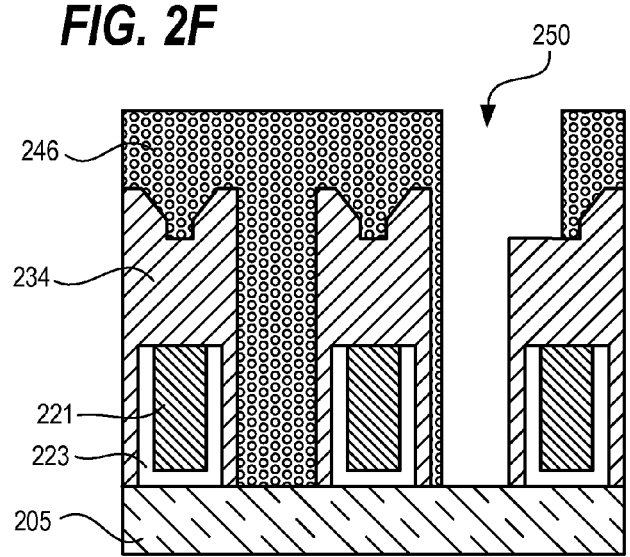
FIG. 2G shows a cross-sectional view of a sequence step of semiconductor device fabrication using a self-aligned contact process.

In FIG. 2F, a third layer 246 can be deposited that fills gaps in the first layer 234 and that covers the first layer 234. Third layer 246 can be a same material as second layer 244, and effectively extend second layer 244. As can be seen, metal gate 221 now has a dual layer cap that is not excessively high above the metal gate. With this dual material cap, a self-aligned contact etch step can then be executed that etches through the third layer 246 and the second structure 202. When etching, a chemistry can be chosen that gives selectivity between the second layer material and the first layer material so that the etching does not punch through the first layer, but instead is limited to etching a minimal portion of the first layer. Example etch chemistries can include a fluorine deficient hydro carbon (CxFy), diluent (Ar/He/N2), and polymer control (O2,CO,CO2,N2), which can include using C4F8/Ar/O2 or C4F6/Ar/O2. FIG. 2G shows an example result of such an etch step revealing a trench, via, or other opening 250 in which a contact can be made. Methods herein can also include filling an etched self-aligned contact passage with a metalized contact.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming self-aligned contacts in a semiconductor device, the method comprising:
    receiving a substrate having a first structure of a first material composition and a Second structure of a second material composition, the second structure being formed immediately adjacent to the first structure, the first structure and second structure being of different heights such that together the first structure and the second structure defining a first topography that is non-planar at an upper surface thereof;
    depositing a first layer on the first topography, the first layer being partially conformal resulting in the first layer defining a second topography, the first layer defining a valley over the first structure and forming a peak over the second structure;
    depositing a second layer on the first layer, the second layer being sufficiently thick to fill the defined valley and cover the peak of the second topography;
    planarizing the second layer down to the first layer above the second structure such that the peak in the first layer is exposed while the defined valley remains filled with the second layer; and
    etching exposed portions of the first layer down until reaching the second structure beneath the first layer, the second layer in the defined valley functioning as a hard mask that impedes etching of the first layer above the first structure relative to etching of the first layer above the second structure.

2. The method of claim 1, further comprising:
    depositing a third layer that fills gaps in the first layer and that covers the first layer.

3. The method of claim 2, further comprising:
executing a self-aligned contact etch process that etches through the third layer and the second structure.

4. The method of claim 3, further comprising filling an etched self-aligned contact passage with a metalized contact.

5. The method of claim 3, wherein receiving the substrate having a first structure of a first material composition and a second structure of a second material composition includes preparing a replacement metal gate (RMG) structure of a gate device on a semiconductor substrate, the RMG structure having a metal gate electrode being the first structure of the first material composition, the metal gate electrode having a side barrier layer and a silicon oxide spacer in contact with the side barrier layer, the silicon oxide spacer being the second structure of the second material, wherein the metal gate electrode and the silicon oxide spacer being different heights includes creating a recess in the metal gate electrode from an initially planarized RMG structure.

6. The method of claim 5, wherein the RMG structure was formed by using double patterning or side wall image transfer.

7. The method of claim 5, wherein the first layer is a dielectric cap layer, and wherein the second layer and the third layer are silicon oxide layers.

8. The method of claim 7, wherein gate pitch is 64 nm or less.

9. The method of claim 7, wherein the metal gate electrode is a tungsten plug.

10. The method of claim 7, wherein preparing the replacement metal gate (RMG) structure of the gate device on the semiconductor substrate includes preparing the RMG structure of a fin field effect transistor (FinFET).

11. The method of claim 7, wherein depositing the dielectric cap layer on the RMG structure includes depositing a conformal layer of silicon nitride.

12. The method of claim 11, wherein etching exposed portions of the dielectric cap layer down until reaching the silicon oxide spacer beneath the dielectric cap layer includes using an etch chemistry that is more selective to silicon nitride as compared to silicon oxide.

13. A method of forming self-aligned contacts in a semiconductor device, the method comprising:
receiving a substrate having a first structure of a first material composition and a second structure of a second material composition, the second structure being formed immediately adjacent to the first structure, the first structure and second structure being of different heights such that together the first structure and the second structure defining a first topography that is non-planar at an upper surface thereof;
depositing a first layer on the first topography, the first layer being partially conformal resulting in the first layer defining a second topography, the first layer defining a valley over the first structure and forming a peak over the second structure;
depositing a second layer on the first layer, the second layer filling the defined valley; and
etching portions of the first layer down until reaching the second structure beneath the first layer, the second layer in the defined valley functioning as a hard mask that impedes etching of the first layer above the first structure relative to etching of the first layer above the second structure.

14. A method of forming self-aligned contacts in a semiconductor device, the method comprising:
providing a substrate having a first structure comprising a metal gate electrode and a second structure comprising a silicon oxide spacer, the second structure being formed adjacent to the first structure and having a greater height than the first structure such that together the first structure and the second structure define a first non-planar topography;
depositing a first layer on the first topography, the first layer being partially conformal resulting in the first layer defining a second non-planar topography different than the first non-planar topography, the first layer defining a valley over the first structure and forming a peak over the second structure;
depositing a second layer on the first layer, the second layer being sufficiently thick to fill the defined valley and cover the peak of the second non-planar topography;
planarizing the second layer down to the first layer above the second structure such that the peak in the first layer is exposed while the defined valley remains filled with the second layer; and
etching exposed portions of the first layer down until reaching the second structure beneath the first layer, the second layer in the defined valley functioning as a hard mask that impedes etching of the first layer above the first structure relative to etching of the first layer above the second structure.

15. The method of claim 14, wherein providing the substrate includes preparing a planarized replacement metal gate (RMG) structure of a gate device on a semiconductor substrate, the RMG structure having the metal gate electrode as the first structure with a side barrier layer, and the silicon oxide spacer being in contact with the side barrier layer, and recessing the first structure to provide the second structure with the greater height.

16. The method of claim 14, further comprising:
depositing a third layer that fills gaps in the first layer and that covers the first layer.

17. The method of claim 16, further comprising:
executing a self-aligned contact etch process that etches through the third layer and the second structure.

18. The method of claim 16, wherein the first layer is a dielectric cap layer, and wherein the second layer and the third layer are silicon oxide layers.

* * * * *